United States Patent
Su et al.

(10) Patent No.: US 7,122,418 B2
(45) Date of Patent: Oct. 17, 2006

(54) METHOD OF FABRICATING ORGANIC LIGHT EMITTING DIODE DEVICE

(75) Inventors: Chih-Hung Su, Kaohsung (TW); Yi-Chang Tsao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 31 days.

(21) Appl. No.: 10/605,214

(22) Filed: Sep. 16, 2003

(65) Prior Publication Data

US 2004/0106226 A1    Jun. 3, 2004

(30) Foreign Application Priority Data

Oct. 4, 2002   (TW) ............................. 91122942 A

(51) Int. Cl.
*H01L 21/329* (2006.01)
(52) U.S. Cl. ................. 438/237; 438/328; 438/778; 438/787; 438/791; 438/958; 438/979
(58) Field of Classification Search ............... 438/141, 438/237, 238, 380, 778, 787, 791, 958, 979, 438/FOR. 157, FOR. 287, FOR. 400, FOR. 415, 438/FOR. 416
See application file for complete search history.

(56) References Cited

U.S. PATENT DOCUMENTS

| | | | | |
|---|---|---|---|---|
| 4,126,931 A | * | 11/1978 | Gandolfi et al. | 257/622 |
| 4,404,733 A | * | 9/1983 | Sasaki | 438/301 |
| 5,693,956 A | * | 12/1997 | Shi et al. | 257/40 |
| 6,204,180 B1 | * | 3/2001 | Tom et al. | 438/689 |
| 6,261,944 B1 | * | 7/2001 | Mehta et al. | 438/624 |
| 6,538,375 B1 | * | 3/2003 | Duggal et al. | 313/506 |
| 6,692,997 B1 | * | 2/2004 | So et al. | 438/151 |
| 6,830,494 B1 | * | 12/2004 | Yamazaki et al. | 445/24 |
| 2001/0055458 A1 | * | 12/2001 | Ladd | 385/129 |
| 2002/0074548 A1 | * | 6/2002 | Lee et al. | 257/59 |
| 2003/0030369 A1 | * | 2/2003 | Shih et al. | 313/504 |
| 2003/0205845 A1 | * | 11/2003 | Pichler et al. | 264/272.11 |

\* cited by examiner

*Primary Examiner*—Matthew Smith
*Assistant Examiner*—Joannie Adelle Garcia
(74) *Attorney, Agent, or Firm*—Jianq Chyun IP Office

(57) ABSTRACT

A method of fabricating an organic electroluminescent device. A substrate comprising an organic electroluminescent unit thereon is provided. A passivation layer is formed on the substrate to cover the organic electroluminescent layer. An ion beam is provided to perform a surface treatment on the passivation layer. A plastic layer is formed on the passivation layer. The steps of forming the passivation layer, providing the ion beam and forming the plastic layer are repeated at least once to enhance device reliability. In addition, a solid passivation layer is formed by the steps of forming the passivation layer, providing the ion beam and forming the plastic layer.

7 Claims, 4 Drawing Sheets

METHOD OF FABRICATING ORGANIC LIGHT EMITTING DIODE DEVICE

CROSS REFERENCE TO RELATED APPLICATIONS

This application claims the priority benefit of Taiwan application serial no. 91122942, filed Oct. 4, 2002.

BACKGROUND OF INVENTION

1. Field of the Invention

The invention relates in general to a method of fabricating an organic electroluminescent device, and more particularly, to a method of fabricating a solid passivation layer for an organic light emitting diode device (OLED).

2. Related Art of the Invention

In the communication industry, the flat panel display applied as the interface between the user and the machine becomes particularly crucial. The current flat panel techniques include plasma display panel (PDP), liquid crystal display (LCD), light emitting diode (LED), vacuum fluorescent display, field emission display (FED) and electrochromic display. Compared to other displays, the organic light emitting diode (OLED) having the characteristics of self-luminescence, view angle independence, power saving, simple fabrication process, low cost, low operation temperature, high response speed and full color, is expected to be the flat panel display of the next generation.

FIG. 1 shows the structure of a conventional organic light emitting diode device. Referring to FIG. 1, the conventional organic light emitting diode unit 112 is constructed on a substrate 100. The organic light emitting diode unit 112 comprises an anode 102, an electroluminescent layer 106 and a cathode 110. In addition, to enhance the luminescent efficiency of the organic light emitting diode unit 112, a hole transportation layer 104 can be formed between the anode 102 and the organic electroluminescent layer 106, while an electron transportation layer 108 can be formed between the electroluminescent layer 106 and the cathode 110. The hole and electron transportation layers 104 and 108 increase combination efficiency of holes and electrons in the electroluminescent layer 106 to obtain an improved luminescent efficiency.

Further referring to FIG. 1, the fabrication method of the organic light emitting diode device includes forming a passivation layer 114 on the substrate 100. The method of forming the passivation layer 114 includes forming an organic passivation layer 114a to cover the electroluminescent layer 112 on the substrate 100, and forming an inorganic passivation layer 114b on the organic passivation layer 114a.

FIG. 2 shows the structure of another organic light emitting diode device. An organic light emitting diode unit 204 is formed on a substrate 200. Passivation layers 202 and 206 are formed on both sides of the organic light emitting diode unit 204. The method of fabricating the organic light emitting diode device includes providing the substrate 200, forming a polymer layer 202a, a ceramic layer 202b and a polymer layer 202c on the substrate 200 to construct a passivation layer 202, and forming an organic electroluminescent layer 204 on the polymer layer 202c. The polymer layer 202a, the ceramic layer 202b and the polymer layer 202c are further formed on the organic electroluminescent layer 204.

As the passivation layer in the conventional organic light emitting diode is the flexible passivation layer, the capability of withstanding external impact is relatively poor. In addition, the flexible passivation layer is typically made of organic material or polymer material, such that the device itself cannot effectively prevent corrosion caused by chemical material.

SUMMARY OF INVENTION

The present invention provides a method of fabricating an organic light emitting diode device and a solid passivation layer to enhance the corrosion resist capability.

The present invention provides a method of fabricating an organic light emitting diode device and a solid passivation layer to enhance the impact resist capability.

The method of fabricating an organic light emitting diode device provided by the present invention comprises (a) providing a substrate on which an organic electroluminescent layer is formed; (b) forming a passivation layer to cover the organic electroluminescent layer; and (c) providing an ion beam to perform a surface treatment on the passivation layer. The steps (b) and (c) are repeated at least once to enhance the device reliability.

In one embodiment of the present invention, a method of fabrication of an organic light emitting diode device is provided. The method comprises the steps of: (a) providing a substrate on which an organic electroluminescent layer is formed; (b) forming a passivation layer on the substrate to cover the organic electroluminescent layer; (c) providing an ion beam to perform a surface treatment on the passivation; and (d) forming a plastic layer on the passivation layer. The steps from (b) to (d) are repeated at least once to improve device reliability.

The present invention further provides a method of fabricating a solid passivation layer on an electronic device formed on a substrate, the method comprising: (a) forming a passivation layer on a substrate to cover the electronic device; and (b) providing an ion beam to perform a surface treatment. The steps (a) and (b) are repeated at least once to improve the protection of the electronic device by the passivation layer.

In one embodiment of the present invention, the method of fabricating a solid passivation layer for protecting an electronic device formed on a substrate includes the following steps: (a) forming a passivation layer on the substrate to cover the electronic device; (b) providing an ion beam to perform surface treatment on the passivation layer; and (c) forming a plastic layer on the passivation layer. The steps (a) to (c) are repeated at least once to improve protection of the electronic device by the passivation layer.

In one embodiment, the material of the passivation layer includes silicon nitride or silicon oxide, and the material of the plastic layer includes ultra high molecular weight polyethylene (UHMWPE) or PMMA.

Preferably, to perform the surface treatment, the ion beam is provided by ion implantation or sputtering.

BRIEF DESCRIPTION OF DRAWINGS

These, as well as other features of the present invention, will become more apparent upon reference to the following drawings.

DETAILED DESCRIPTION

First Embodiment

Figure 1:
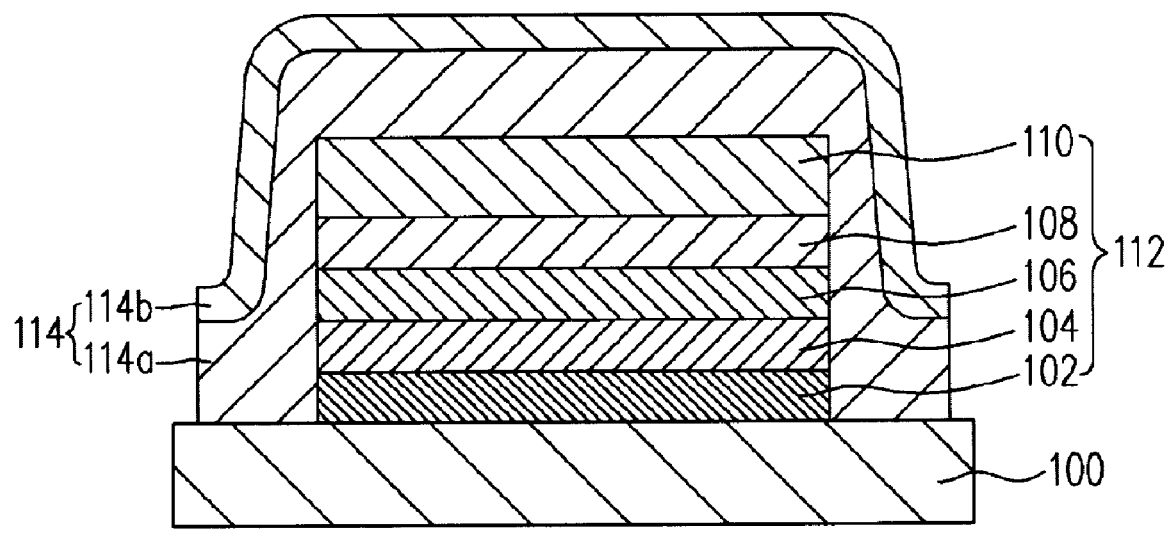
FIG. 1 shows the structure of a conventional organic light emitting diode device.
Figure 2:
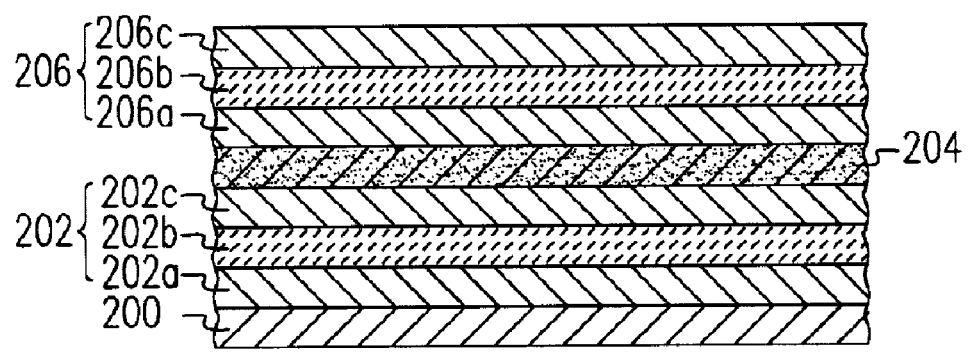
FIG. 2 shows the structure of another conventional organic light emitting diode device.
Figure 3A:
FIGS. 3A to 3D shows a first embodiment of a method of fabricating an organic light emitting diode device.

FIGS. 3A to 3D show the first embodiment of a method for fabricating an organic light emitting diode device. In FIG. 3A, a substrate 300 is provided. The substrate 300 includes a glass substrate, a plastic substrate or a transparent substrate made of other material. An organic light emitting diode unit 302 is formed on the substrate 300. The organic light emitting diode unit 302 includes multi-layer structure including a transparent anode, a metal cathode, an organic electroluminescent layer, an electron transportation layer (ETL), a hole transportation layer (HTL), an electron injection layer (EIL), and a hole injection layer (HIL), for example.

Figure 3B:
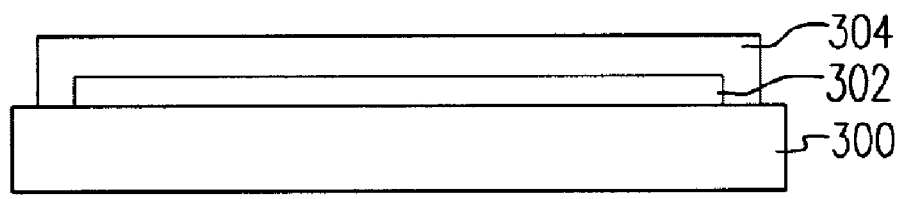
Figure 3C:
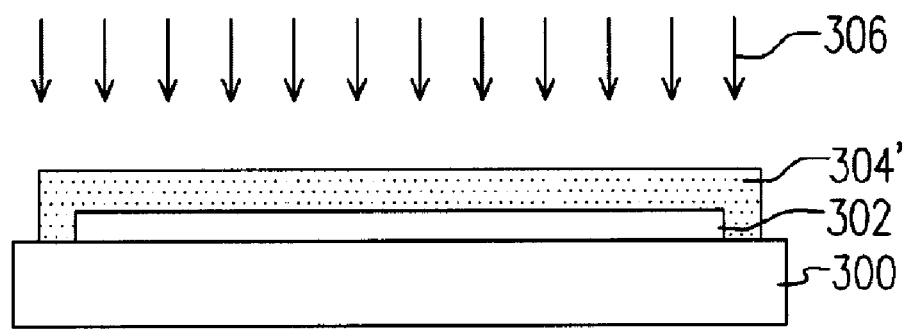

Referring to FIGS. 3B to 3C, a passivation layer 304 is formed to cover the organic light emitting diode unit 302 on the substrate 300. The material for forming the passivation layer 304 includes silicon oxide or silicon nitride. A step of surface treatment is performed on the passivation layer 304. An ion beam 306 is provided by either ion implantation or sputtering to perform the surface treatment, such that the surface bonding of the passivation layer 304 is reinforced to form a solid passivation layer 304'. The solid passivation layer 304' has higher hardness and improved corrosion resist.

The fabrication of the organic light emitting diode device is complete after forming the passivation layer 304' by providing the ion beam 306. However, in this embodiment, a treatment is further performed on the organic light emitting diode unit 302 covered with the solid passivation layer 304" to improve the impact resist.

Figure 3D:
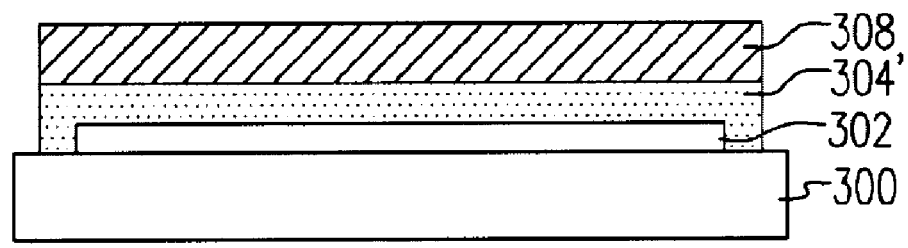

Referring to FIG. 3D, to enhance impact resist, a plastic layer 308 with a relatively higher hardness is formed on the passivation layer 304'. The material for forming the plastic layer 308 includes ultra high molecular weight polyethylene (UHMWPE) or PMMA. However, it is appreciated that the plastic layer 308 can also be made of other material with higher hardness.

Second Embodiment

Figure 4A:
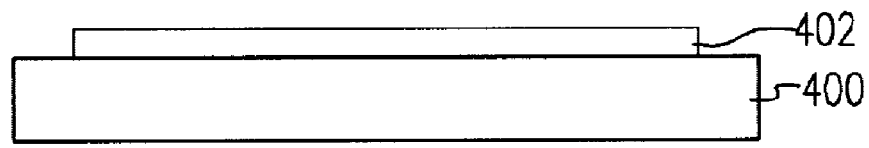
FIGS. 4A to 4F shows another embodiment of a method of fabricating an organic light emitting diode device.

FIGS. 4A to 4F show a second embodiment of the method for fabricating an organic light emitting diode device. Referring to FIG. 4A, a substrate 400 is provided. The substrate 400 includes a glass substrate, a plastic substrate or a transparent substrate made of other material. An organic light emitting diode unit 402 is formed on the substrate 300. The organic light emitting diode unit 302 includes multi-layer structure including a transparent anode, a metal cathode, an organic electroluminescent layer, an electron transportation layer (ETL), a hole transportation layer (HTL), an electron injection layer (EIL), and a hole injection layer (HIL), for example.

Figure 4B:
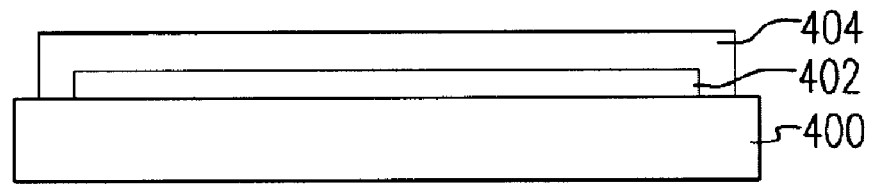
Figure 4C:
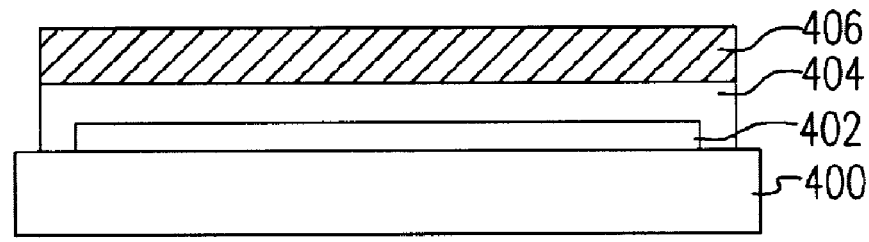

Referring to FIGS. 4B to 4C, a passivation layer 404 is formed to cover the organic light emitting diode unit 402 on the substrate 400. The material for forming the passivation layer 404 includes silicon oxide or silicon nitride. A plastic layer 406 with relatively high hardness is formed on the passivation layer 404. The material of the plastic layer 406 includes UHMWPE or PMMA. It is appreciated that the plastic layer 406 may also be made of other material with relatively high hardness.

Figure 4D:
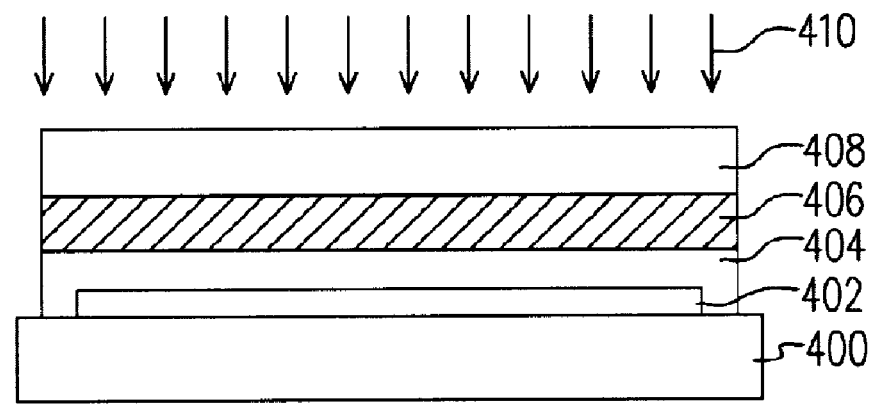
Figure 4E:
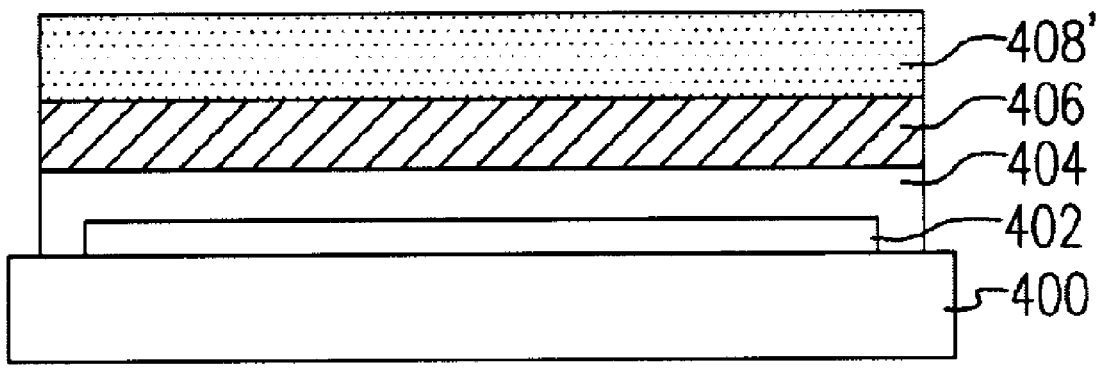

Referring to FIGS. 4D to 4E, a passivation layer 408 is formed on the plastic layer 406. A step of surface treatment is performed on the passivation layer 304. An ion beam 410 is provided by either ion implantation or sputtering to perform the surface treatment, such that the surface bonding of the passivation layer 408 is reinforced to form a solid passivation layer 408'. The solid passivation layer 408" has higher hardness and improves corrosion resist.

The fabrication of the organic light emitting diode device is complete after forming the passivation layer 408' by providing the ion beam 410. However, in this embodiment, a treatment is further performed on the organic light emitting diode unit 402 covered with the solid passivation layer 408" to improve the impact resist.

Figure 4F:
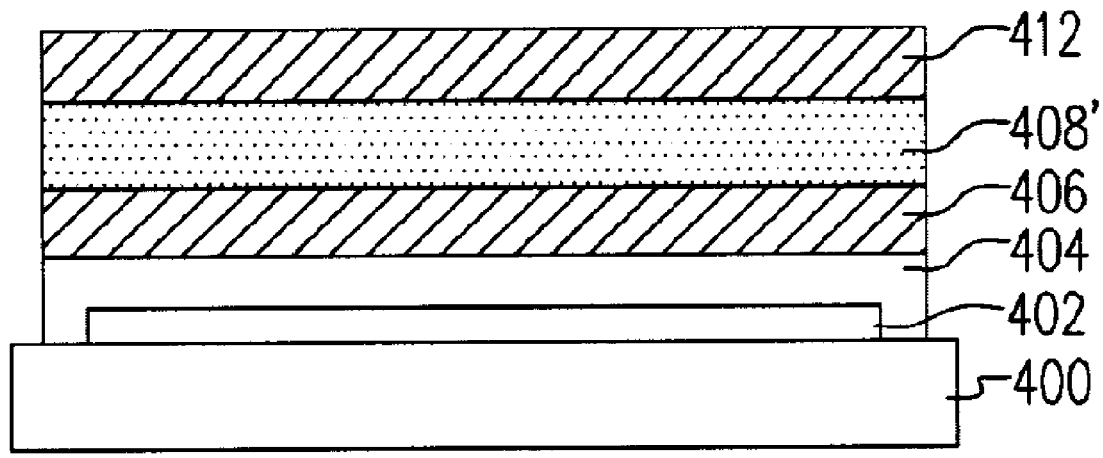

Referring to FIG. 4F, to enhance impact resist, a plastic layer 412 with a relatively higher hardness is formed on the passivation layer 408'. The material for forming the plastic layer 412 includes ultra high molecular weight polyethylene (UHMWPE) or PMMA. However, it is appreciated that the plastic layer 308 can also be made of other material with higher hardness.

In the above embodiments, the numbers of the passivation layers and the plastic layers are determined according to specific product requirements. The number of the surface treatment may also be varied. For example, the surface treatment may be performed on all the passivation layers or a part of the passivation layer such as the topmost passivation layer only.

According to the above, the method of fabricating an organic light emitting diode device provided by the present invention includes the following advantages.

1. The method of fabricating the organic light emitting diode device and the solid passivation layer effectively enhances the device corrosion resist.

2. The method of fabricating the organic light emitting diode device and the solid passivation layer effectively enhances the device impact resist.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

The invention claimed is:

1. A method of fabricating an organic light emitting diode device, comprising:
   (a) providing a substrate having an organic light emitting diode unit thereon;
   (b) forming a passivation layer on the substrate to cover the organic light emitting diode unit;
   (c) providing an ion beam to perform surface treatment on the passivation layer, wherein the ion beam is provided by ion implantation;
   (d) forming a plastic layer on the passivation layer.

2. The method according to claim 1, wherein the passivation layer is formed of either silicon nitride or silicon oxide.

3. The method according to claim 1, further comprising repeating the steps (b) to (d) at least once.

4. The method according to claim 1, wherein the plastic layer is made of ultra high molecular weight polyethylene or PMMA.

5. A method of forming a solid passivation layer to protect an electronic device formed on a substrate, comprising:

(a) forming a passivation layer to cover the electronic device;
(b) providing an ion beam to perform surface treatment on the passivation layer, wherein the ion beam is provided by ion implantation; and
(c) forming a plastic layer on the passivation layer; and
(d) repeating steps (a) to (c) at least once.

6. The method according to claim 5, wherein the passivation layer is made of silicon nitride or silicon oxide.

7. The method according to claim 5, wherein the plastic layer is made of ultra high molecular polyethylene or PMMA.

* * * * *